(12) United States Patent
Nomura et al.

(10) Patent No.: US 7,600,432 B2
(45) Date of Patent: Oct. 13, 2009

(54) PRESSURE SENSOR WITH SENSING CHIP PROTECTED BY PROTECTIVE MATERIAL

(75) Inventors: Takashi Nomura, Kariya (JP); Hironobu Baba, Oobu (JP); Yoshifumi Watanabe, Kariya (JP)

(73) Assignee: Denso Corporation, Kariya (JP)

( * ) Notice: Subject to any disclaimer, the term of this patent is extended or adjusted under 35 U.S.C. 154(b) by 118 days.

(21) Appl. No.: 11/907,400

(22) Filed: Oct. 11, 2007

(65) Prior Publication Data

US 2008/0264174 A1 Oct. 30, 2008

(30) Foreign Application Priority Data

Oct. 12, 2006 (JP) .............................. 2006-278426

(51) Int. Cl.
*G01L 9/00* (2006.01)
(52) U.S. Cl. .......................................... 73/706; 73/756
(58) Field of Classification Search ............ 73/700–756
See application file for complete search history.

(56) References Cited

U.S. PATENT DOCUMENTS 6,651,508 B2   11/2003   Baba et al.
7,385,296 B2 *  6/2008  Ohta ........................... 257/784
2007/0017294 A1 * 1/2007 Asada et al. ................... 73/754
2008/0098819 A1 * 5/2008 Murata ......................... 73/708
2009/0071259 A1 * 3/2009 Tanaka et al. ................. 73/725

FOREIGN PATENT DOCUMENTS

| JP | H05-283714 | 10/1993 |
| JP | H09-250943 | 9/1997 |
| JP | H11-064143 | 3/1999 |
| JP | 2000-028461 | 1/2000 |
| JP | 2000-131171 | 5/2000 |
| JP | 2000-337988 | 12/2000 |
| JP | 2001-296197 | 10/2001 |
| JP | 2002-221462 | 8/2002 |
| JP | 2006-220456 | 8/2006 |

\* cited by examiner

*Primary Examiner*—Andre J Allen
(74) *Attorney, Agent, or Firm*—Posz Law Group, PLC (57) ABSTRACT

A pressure sensor is provided, which includes a case, a sensing chip located in the case for detecting pressure, and a protective material for covering and protecting the sensing chip in the case. Corners of the case, which are in contact with the protective material are each formed into a rounded shape. A curvature radius of each of the corners is adapted to be 0.5 mm or more.

7 Claims, 5 Drawing Sheets

PRESSURE SENSOR WITH SENSING CHIP PROTECTED BY PROTECTIVE MATERIAL

CROSS-REFERENCE TO RELATED APPLICATION

This application is based on and claims the benefit of priority from earlier Japanese Patent Application No. 2006-278426 filed Oct. 12, 2006, the description of which is incorporated herein by reference.

BACKGROUND OF THE INVENTION

1. Technical Field of the Invention

The present invention relates to a pressure sensor in which a sensing chip for detecting pressure is provided in a resin-molded case, being covered with a protective material.

2. Related Art

Pressure sensors of this type have been known as suggested, for example, in Japanese Patent Application Laid-Open No. 2002-221462. As disclosed in this literature, a pressure sensor of this type includes a resin-molded case, a sensing chip provided in the case for detecting pressure, and a protective material for covering and protecting the sensing chip provided in the case.

Such a pressure sensor uses a soft material, such as a gel, as the protective material to protect the pressure sensor from the external environment. This type of pressure sensor is adapted to apply a measuring pressure force to the sensing chip through the protective material to carry out measurement.

This type of pressure sensor, however, produces bubbles in the protective material during a temperature or pressure cycle, whereby variation is caused in the characteristics of pressure transmission to the sensing chip through the protective material, leading to problematic variation in the sensor characteristics.

The inventors studied the mechanism of how the bubbles are produced in the protective material. The mechanism will be explained referring to FIG. 8 which shows a typical cross-sectional configuration of this type of conventional pressure sensor.

Figure 8:
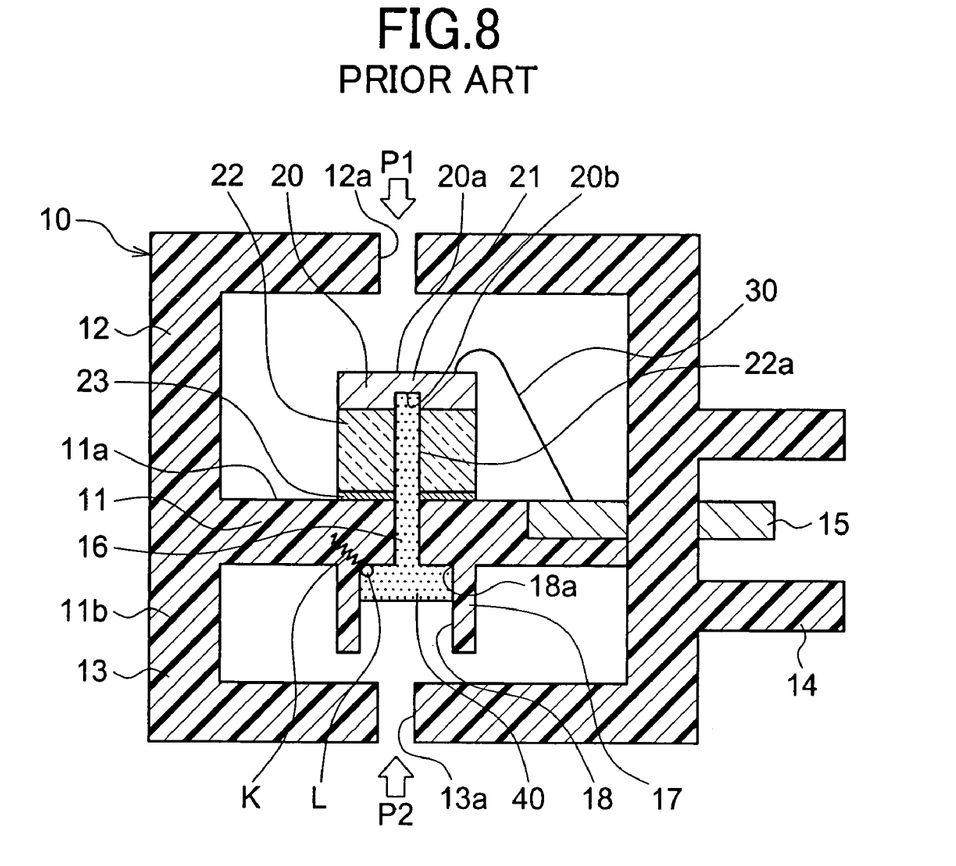
FIG. 8 is a cross-sectional view of a typical conventional pressure sensor.

Among this type of conventional pressure sensors, the figure shows, in particular, a relative pressure-type pressure sensor, in which a rear surface of a sensing chip is sealed.

A sensing chip 20 has front and rear surfaces 20a and 20b, to which pressure forces P1 and P2 are applied, respectively, and is fixedly located in a case 10, so that the rear surface 20b faces a chip mount 11 of the case 10. The chip mount 11 of the case 10 is formed, in its one surface 11b, with a pressure introduction hole 16 for introducing the pressure force P2 to the rear surface 20b of the sensing chip 20.

The case 10 is provided with a cylindrical wall 17 projecting from the surface 11b of the chip mount 11 so as to enclose the pressure introduction hole 16 along a periphery thereof.

An internal space defined by the cylindrical wall 17 projecting from the surface 11b of the chip mount 11 constitutes a protective material injection chamber 18. The pressure introduction hole 16 and the protective material injection chamber 18 are filled with a protective material 40, such as a soft gel, that serves as a pressure transmission medium. The rear surface 20b of the sensing chip 20 is sealed with the protective material 40.

The first pressure force P1 in such a relative pressure-type pressure sensor (hereinafter referred to as a "relative pressure sensor") is applied to the front surface 20a of the sensing chip, and the second pressure force P2 is applied to the rear surface 20b of the sensing chip 20 through the protective material 40.

The sensing chip 20 outputs an electric detection signal based on a differential pressure between the applied pressure forces P1 and P2. The detection signal is adapted to be outputted to an external unit through a bonding wire 30 and a conductor 15.

Since the case 10 of this type of pressure sensor is formed by molding a resin, small cracks, such as a micro crack K shown in FIG. 8, may be caused when the case 10 is molded. Such a crack K is likely to be caused at a corner 18a where stress particularly tends to be concentrated in the case 10.

The crack K grows, for example, with a temperature cycle. Then, a pressure cycle, for example, allows air to enter the case 10 through the crack K, which air causes bubbles, such as a bubble L shown in FIG. 8, in the protective material 40.

SUMMARY OF THE INVENTION

The present invention has been made in light of the problem mentioned above, and has a first object of providing a pressure sensor having a pressure detection sensing chip located in a resin-molded case and covered with a protective material, which pressure sensor is able to prevent the occurrence of cracks as much as possible at a portion of the case contacting the protective material. The present invention has as its second object to provide such a pressure sensor, which is able to prevent production of bubbles as much as possible in the protective material in the event cracks are caused at the portion of the case contacting the protective material.

In order to achieve the above objects, the inventors of the present invention devoted themselves to various studies. The studies revealed that, in a resin-molded case, cracks are likely to occur at angulated corners of the case. It is considered that this is because stress tends to be concentrated at the corners of the case.

According to one mode of the present invention, there is provided a pressure sensor, comprising: a case made of resin; a sensing chip mounted in the case to sense pressure applied to the sensing chip; and a protective material arranged in the case to cover the sensing chip for protection thereof; wherein the case has a corner contacting the protective material, the corner being rounded to have a curvature radius of 0.5 mm or more.

Thus, angulated corners that are likely to cause cracks can substantially be eliminated by rounding the corners of the resin-molded case, which corners are in contact with the protective material, and by giving the curvature radius of 0.5 mm or more to each of the corners.

Accordingly, in the pressure sensor in which the sensing chip for detecting pressure is located in the resin-molded case, being covered with and protected by the protective material, the present invention can prevent the occurrence of cracks as much as possible at portions of the case contacting the protective material.

As another mode of the present invention, there is provided a pressure sensor, comprising: a case made of resin; a sensing chip mounted in the case to sense pressure applied to the sensing chip; and a protective material arranged in the case to cover the sensing chip for protection thereof; wherein the case has a corner contacting the protective material, the corner having an obtuse angle of 135 degrees or more.

Thus, the obtuse angle of 135 degrees or more of the corners of the resin-molded case contacting the protective material can mitigate the concentration of stress at the corners that are likely to cause cracks.

Therefore, according to the present invention, the occurrence of cracks can be prevented as much as possible at the portions of the resin-molded case contacting the protective material, in the pressure sensor having the sensing chip for detecting pressure, which chip is located in the case being covered with and protected by the protective material.

The inventors then studied an issue of preventing entry of air into the protective material through cracks in the event such cracks have been caused at the corners that are likely to cause cracks in the resin-molded case.

Still another mode of the present invention, there is provided a pressure sensor, comprising: a case made of resin and formed to a corner; a sensing chip mounted in the case to sense pressure applied to the sensing chip; and a protective material arranged in the case to cover the sensing chip for protection thereof, the corner contacting the protective material arranged in the case, wherein the proactive material is composed of a first protective material arranged to contact the corner and a second protective material arranged to cover the first protective material, formed to be softer from the first protective material, and arranged to contact the sensing chip; and a dam portion protruded from the case to prevent the first protective material from shifting toward the second protective material.

Thus, the protective material has a two-layer structure consisting of the comparatively hard first protective material, which is made of a material having a penetration number of 30 or less and a thickness of 0.1 mm or more, or a material having a penetration number of 40 or less and a thickness of 0.2 mm or more, and the comparatively soft second protective material. In this structure, the first protective material is provided so as to contact the corner of the case. Thus, in the event cracks have been caused at the corner, the comparatively hard first protective material can suppress the entry of air therein through the cracks.

Also, in this mode of the invention, the dam portion provided at the case allows the entry of the comparatively soft second protective material into the pressure introduction hole toward the sensing chip to contact and seal the sensing chip. Accordingly, the measuring pressure force can be transmitted to the sensing chip through the soft second protective material as in the conventional pressure sensors, so that the function of detection can be retained as in the conventional pressure sensors.

Thus, according to the present invention, the production of bubbles in the protective material can be prevented as much as possible in the event cracks have been caused at the portions of the resin-molded case contacting the protective material, in the pressure sensor having the sensing chip for detecting pressure, which chip is located in the case being covered with and protected by the protective material.

It should be appreciated that the bracketed reference numbers assigned to the individual components in the above description indicate correspondency to the components in the preferred embodiments of the present invention provided below.

DETAILED DESCRIPTION OF THE PREFERRED EMBODIMENTS

Hereinafter will be described some embodiments of the present invention referring to the accompanying drawings. It should be appreciated that, throughout the embodiments, the identical or similar components or portions are given the same reference numerals for the sake of omitting explanation.

First Embodiment

A pressure sensor according to a first embodiment can be applied to, but not limited to, a sensor for detecting pressure of exhaust gas, which sensor is one of the components constituting an exhaust gas cleaning system (DPF (diesel particulate filter) system) for a diesel engine for vehicles, for example.

[Configuration]

Figure 1:
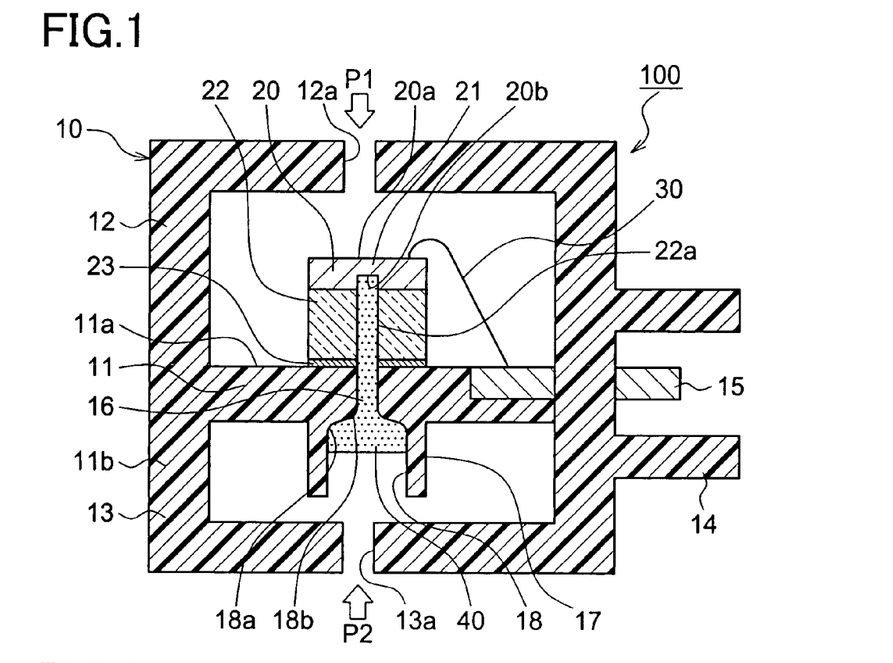
FIG. 1 is a schematic cross sectional view illustrating a relative pressure sensor according to a first embodiment of the present invention.

FIG. 1 is a schematic cross-sectional view illustrating a relative pressure sensor 100 according to the first embodiment of the present invention.

In FIG. 1, a case 10 defining the body of the pressure sensor 100 is made of a resin or the like, such as PBT (polybutylene terephthalate) and PPS (polyphenylene sulfide).

The case 10 is chiefly structured by a chip mount 11 for mounting a sensing chip 20, which will be described later, first and second pressure introduction portions 12 and 13, which are integrated into the chip mount 11 at upper and lower surfaces 11a and 11b, respectively, of the chip mount 11, and a connector 14.

In other words, the first and second pressure introduction portions 12 and 13 are defined in the interior of the case 10 by the chip mount 11. The components 11 to 14 may be integrally molded, or may be individually molded and then integrated by adhesion, for example.

The first pressure introduction portion 12 is provided on the side of the upper surface 11a of the chip mount 11, and is adapted to introduce a first pressure force P1 through an opening 12a formed therein to the side of the upper surface 11a of the chip mount 11. The second pressure introduction portion 13 is provided on the side of the lower surface 11b of the chip mount 11, and is adapted to introduce a second pressure force P2 through an opening 13a formed therein to the side of the lower surface 11b of the chip mount 11.

The connector 14 establishes electrical connection between the pressure sensor 100 and an external unit. A conductor 15, such as a terminal, is formed in the case 10 by insert molding. The conductor 15 is made of a conductive material, such as copper or 42 alloy, being partially exposed in the connector 14 to electrically connect the pressure sensor 100 and an external unit.

The sensing chip 20 is accommodated in the case 10, being located at the upper surface 11a of the chip mount 11. The sensing chip 20 is configured as a sensing part that produces an electrical signal of a level corresponding to an applied pressure.

The sensing chip 20 is made up of a semiconductor substrate, such as a silicon semiconductor. The sensor 20 has a diaphragm 21, or a thin strain portion, formed in its front surface (upper surface in FIG. 1) 20a, and a recess formed in its rear surface (lower surface in FIG. 1) 20b by anisotropic etching or the like to structure the diaphragm 21.

In other words, the sensing chip 20 is a semiconductor diaphragm chip, with the recess being formed in the rear surface 20b of the sensing chip 20 and with the diaphragm 21 as a strain portion being formed in the front surface 20a opposed to the recess.

The sensing chip 20 receives the pressure forces P1 and P2 through the front and rear surfaces 20a and 20b thereof, respectively. Then, a differential force between the pressure forces P1 and P2 strains the diaphragm 21, so that a bridge circuit, for example, made up of a resistor formed in the diaphragm 21 can output a signal based on the strain.

A seat 22 made of glass or the like is integrated into the sensing chip 20 by anode bonding, for example, through the rear surface 20b of the sensing chip 20. The sensing chip 20 is adhered to the upper surface 11a of the chip mount 11 through the seat 22 and an adhesion portion 23 for accommodation and fixation in the case 10.

Thus, the sensing chip 20 is fixed to the case 10 so that the rear surface 20b faces the case 10. An adhesive structuring the adhesion portion 23 may include a soft adhesive, such as a silicone-based adhesive or a fluorosilicone-based adhesive, which is unlikely to permit the thermal stress of the adhesion portion 23 to influence the sensor characteristics.

A hole (through hole) 22a is formed in the seat 22. Further, a pressure introduction hole 16 is formed in the chip mount 11 for alignment with the hole 22a of the seat 22. The pressure introduction hole 16 is a through hole that passes through the chip mount 11 from the upper surface 11a to the lower surface 11b.

Specifically, the pressure introduction hole 16 is blocked by the sensing chip 20 at the upper surface 11a of the chip mount 11, whereby the sensing chip 20 defines a space on the side of the upper surface 11a and a space on the side of the lower surface 11b.

As shown in FIG. 1, an end portion of the conductor 15 formed in the case 10 by insert molding is exposed onto the upper surface 11a of the chip mount 11.

In the case 10, the sensing chip 20 is electrically connected to the exposed portion of the conductor 15 through a bonding wire 30 made of gold, aluminum or the like. Thus, the sensing chip 20 is adapted to be electrically connected to an external unit through the bonding wire 30 and the conductor 15, so that signal output, for example, can be conducted.

The pressure introduction hole 16 is provided for introducing a pressure force to the rear surface 20b of the sensing chip 20. The lower surface 11b of the chip mount 11 is taken as one surface of the case 10. Accordingly, the pressure introduction hole 16 can be regarded as being provided at one surface of the case 10.

The case 10 is provided with a cylindrical wall 17 projecting from the lower surface 11b of the chip mount 11, or one surface of the case 10, to enclose the pressure introduction hole 16 along a periphery thereof. The cylindrical wall 17 is integrally molded with the chip mount 11.

In the present embodiment, an internal space defined by the cylindrical wall 17 and the lower surface 11b of the chip mount 11 constitutes a protective material injection chamber 18. The pressure introduction hole 16, the protective material injection chamber 18 and the hole 22a of the seat 22 are filled with a protective material 40. Of these holes, the protective material injection chamber 18 and the hole 22a of the seat 22 compose a recess portion.

The sensing chip 20 is protected by the protective material 40. The present embodiment provides the pressure sensor 100 as a relative pressure sensor, in which the rear surface of the sensing chip 20 is sealed. Specifically, the rear surface 20b of the sensing chip 20 is sealed with the protective material 40. More specifically, the portion of the rear surface 20b sealed by the protective material is protected by the protective material 40.

Thus, the protective material 40 sealing the rear surface 20b of the sensing chip 20 can prevent entry of foreign substances into the pressure introduction hole 16. As a result, the sensing chip 20 is prevented from having a trouble of being varied in its characteristics, which would be caused by the attachment of contaminants to the rear surface 20b of the sensing chip 20. Further, other troubles can also be prevented, such as blockage of the pressure introduction hole 16 that would be caused by frozen dew drops, and breakage of the sensing chip 20 that would be caused by the volume expansion ascribed to the frozen dew drops.

Materials used for the protective material 40 include, but not limited to, fluorine gels, silicone gels and fluorosilicone gels. In particular, where the pressure of exhaust gas is measured, a fluorine gel having good acid resistivity should desirably be used as the protective material 40 because the condensate of exhaust gas, which is melt with nitrogen oxides or sulfur oxides, exerts strong acidness.

The structure of the pressure sensor 100 according to the present embodiment is unique in that corners 18a and 18b of the case 10, which are in contact with the protective material 40, each have a rounded shape. Specifically, as shown in FIG. 1, the corners 18a and 18b at an inner face of the protective material injection chamber 18, which are in contact with the protective material 40, are each formed into a rounded shape.

As shown in FIG. 1, the corner 18a is provided between the cylindrical wall 17 and the lower surface 11b of the chip mount 11, and the corner 18b is provided at the entrance of the pressure introduction hole 16, in the lower surface 11b of the chip mount 11, both being rounded. These rounded corners 18a and 18b can be readily formed by changing a mold for resin molding of the case 10.

The inventors studied on the relationship between a curvature radius R of the corners 18a and 18b and production of bubbles. Specifically, the studies involved experiments using a temperature and pressure cycling test, in which a temperature cycle and a pressure cycle are simultaneously applied. In the following Table 1 indicating the results of the experiments, the mark "X" represents that bubbles were produced, and the mark "O" represents that no bubbles were produced.

TABLE 1

| R (mm)  | 0.3 | 0.4 | 0.5 | 0.6 | 0.7 | 0.8 |
|---------|-----|-----|-----|-----|-----|-----|
| Bubbles | X   | X   | O   | O   | O   | O   |

O: No bubbles produced
X: Bubbles produced

As can be seen from Table 1, bubbles were produced when the curvature radius R of the corners 18a and 18b was 0.3 mm or 0.4 mm, and no bubbles were produced when the curvature radius R was 0.5 mm or more. When bubbles were produced, the rate was sufficiently small compared with the conventional pressure sensor. Therefore, the rounded shape, per se, of the corners 18a and 18b can be regarded as exerting the effect of suppressing production of bubbles. Meanwhile, the rounded corner having a curvature radius of 0.5 mm or more could ensure prevention of bubble production. Accordingly, use of the curvature radius R of 0.5 mm or more for the corners 18a and 18b can reliably prevent bubbles from being generated. The study on the bubble production was made involving the curvature radius R of up to 0.8 mm of the corners 18a and 18b. This is because larger curvature radius R of the corners 18a and 18b may require the chip mount 11 and the cylindrical wall 17 to be so much the larger. In order to prevent the increase in the size of these components, the curvature radius R may preferably be 0.8 mm or less.

As shown in FIG. 1, the pressure sensor 100 is configured such that the first pressure force P1, such as atmospheric pressure, introduced to the first pressure introduction portion 12 is applied to the front surface 20a of the sensing chip 20, and that the second pressure force P2, such as exhaust gas pressure, introduced from the pressure introduction hole 16 to the second pressure introduction portion 13 through the protective material 40 is applied to the rear surface 20b of the sensing chip 20.

The diaphragm 21 in the sensing chip 20 is strained by a differential pressure between the pressure from the side of the front surface 20a and the pressure from the side of the rear surface 20b, by which an electrical signal corresponding to the level of the strain is outputted from the sensing chip 20. The electrical signal is adapted to be outputted to an external unit through the bonding wire 30 and the conductor 15.

Hereinafter, a method for manufacturing the pressure sensor 100 is described. First, the conductor 15 is formed by insert molding. Then, the case 10 is prepared integrating the chip mount 11, the pressure introduction portions 12 and 13, and the connector 14. The case 10 can be readily formed by molding.

Then, the sensing chip 20 is prepared, which is applied with pressure forces to its front and rear surfaces 20a and 20b. The sensing chip 20 and the seat 22 are bonded by anode bonding or the like.

The sensing chip 20 integrated with the seat 22 is fixedly adhered to the upper surface 11a of the chip mount 11 of the case 10, so that the rear surface 20b of the sensing chip 20 faces the pressure introduction hole 16. Subsequently, the sensing chip 20 and the conductor 15 are wire bonded so that electrical connection can be established therebetween.

Then, the protective material 40 is filled in from the protective material injection chamber 18 of the case 10. Specifically, the protective material 40 is injected to and filled in the hole 22a of the seat 22 and the pressure introduction hole 16 through the protective material injection chamber 18, followed by vacuum deaeration for preventing bubble production, and heating and curing. Thus, the state as shown in FIG. 1 can be attained.

In this way, when the filling of the protective material 40 is completed, the pressure sensor 100 of the present embodiment shown in FIG. 1 is completed.

The present embodiment provides the pressure sensor 100 including the resin-molded case 10, the sensing chip 20 for detecting pressure provided in the case 10, and the protective material 40 for covering and protecting the sensing chip 20 in the case 10. The corners 18a and 18b contacting the protective material 40 of the case 10 are each formed into a rounded shape.

In particular, the pressure sensor 100 according to the present embodiment has the configuration as provided by the following items 1) to 4).

1) The sensing chip 20 for detecting pressure having the front and rear surfaces 20a and 20b to which pressure forces are applied is fixedly located in the case 10, so that the rear surface 20b faces the chip mount 11 of the case 10.

2) The lower surface 11b of the chip mount 11, or one face of the case 10, is formed with the pressure introduction hole 16 for introducing pressure into the rear surface 20b of the sensing chip 20.

3) The cylindrical wall 17 is provided, projecting from the lower surface 11b of the chip mount 11 to enclose the pressure introduction hole 16 along a periphery thereof.

4) The internal space defined by the cylindrical wall 17 and the lower surface 11b is provided as the protective material injection chamber 18, which, together with the pressure introduction hole 16 and the hole 22a, is filled with the protective material 40 so as to seal the rear surface 20b of the sensing chip 20.

The configuration as provided by the above items 1) to 4) constitutes the relative pressure sensor 100 in which the rear surface of the sensing chip 20 is sealed.

The relative pressure sensor 100 according to the present embodiment is provided therein with the protective material injection chamber 18 whose corners 18a and 18b provided at the inner face thereof and in contact with the protective material 40 are each formed into a rounded shape with the curvature radius R being 0.5 mm or more.

According to the present embodiment, the portions of the resin-molded case 10, which are in contact with the protective material 40, i.e. the corners 18a and 18b of the protective material injection chamber 18, are each rounded to substantially eliminate angulated corners which would otherwise have tended to cause cracks at the chamber 18.

Thus, the occurrence of cracks at the portions of the resin-molded case 10 contacting the protective material 40 can be prevented as much as possible, in the pressure sensor 100 having the sensing chip 20 for detecting pressure, which chip is located in the case 10 being covered with and protected by the protective material 40, or particularly in the relative pressure sensor 100 having the sensing chip 20 whose rear surface is sealed.

The pressure sensor 100 according to the present embodiment is provided with the protective material injection chamber 18 having a plurality of corners 18a and 18b provided at the inner face thereof and in contact with the protective material 40, and all of the plurality of corners 18a and 18b are rounded.

Among the plurality of corners 18a and 18b, only one may be rounded, which is more likely to cause cracks. However, it is preferable that all of the plurality of corners 18a and 18b are rounded, so that angulated corners can be completely eliminated.

[Modifications]

As described above, among the plurality of corners 18a and 18b contacting the protective material 40, only one of them may be rounded. This configuration may also have an advantage of preventing the occurrence of cracks.

Figure 2:
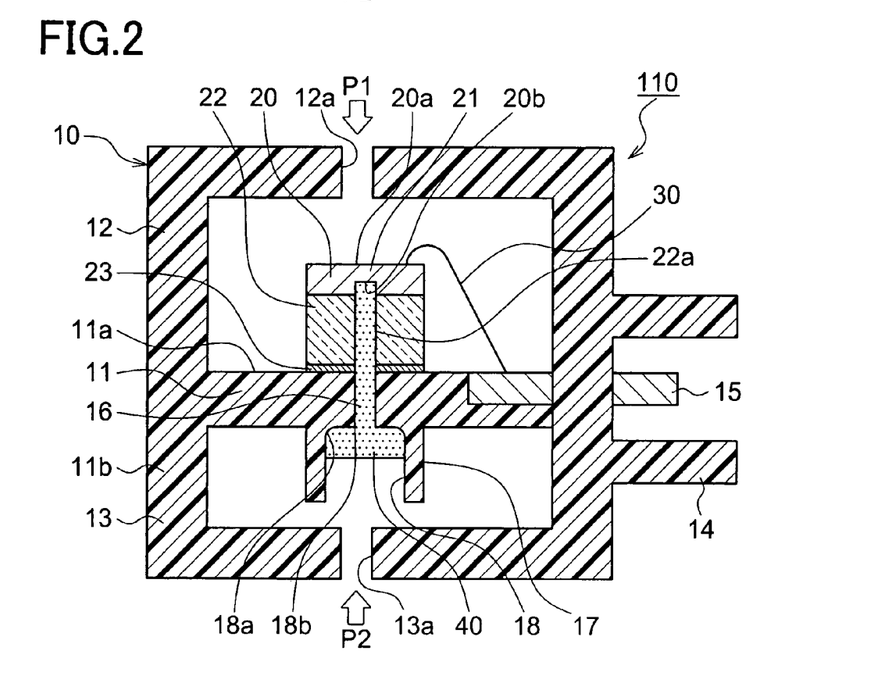
FIG. 2 is a schematic cross sectional view illustrating a relative pressure sensor as a modification of the first embodiment.

FIG. 2 is a schematic cross-sectional view illustrating a relative pressure sensor 110 as a modification of the first embodiment.

The pressure sensor 110 according to this modification also includes the resin-molded case 10, the sensing chip 20 for detecting pressure provided in the case 10, and the protective material 40 for covering and protecting the sensing chip 20 provided in the case 10. The corner 18a of the case 10, which resides in the inner face of the protective material injection chamber 18 and in contact with the protective material 40, is formed into a rounded shape.

As shown in FIG. 2, the present modification also has the configuration as provided by the above items 1) to 4) to constitute the relative pressure 110.

In the present modification, the rounded shape is imparted to not all of the corners 18a and 18b, but to only the corner 18a between the cylindrical wall 17 and the lower surface 11b of the chip mount 11.

The studies made by the inventors revealed that, among the corners 18a and 18b of the protective material injection chamber 18, cracks are particularly likely to be caused at the corner 18a between the cylindrical wall 17 and the lower surface 11b of the chip mount 11, or one surface of the case 10, structuring the chamber 18.

Thus, the rounded shape of the corner 18a with the curvature radius R of 0.5 mm or more as in the pressure sensor 110 of the present modification may also prevent the occurrence of cracks as much as possible at the portion of the case 10 contacting the protective material 40.

Second Embodiment

Figure 3:
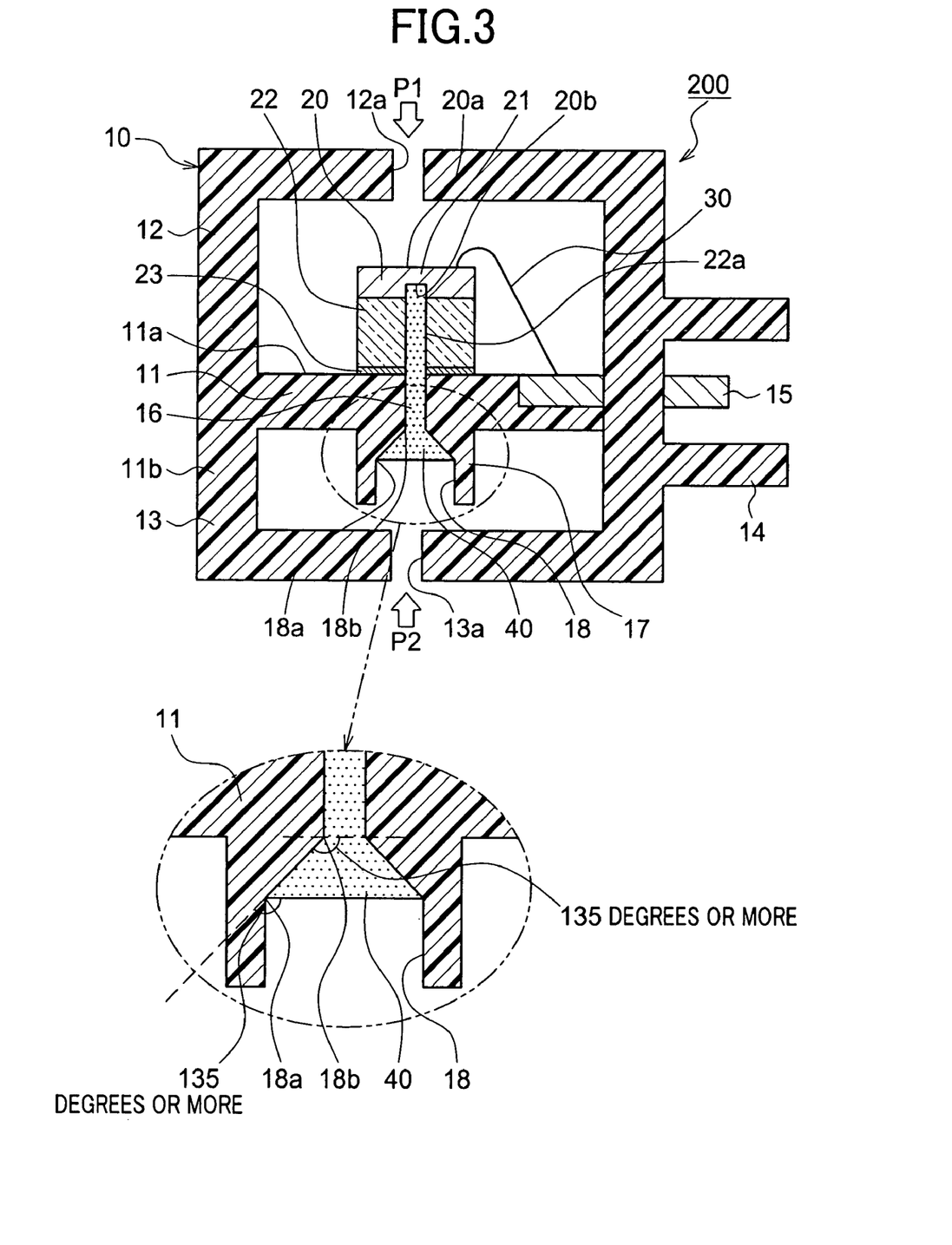
FIG. 3 is a schematic cross sectional view illustrating a relative pressure sensor according to a second embodiment of the present invention.

FIG. 3 is a schematic cross-sectional view of a relative pressure sensor 200 according to a second embodiment of the present invention.

The pressure sensor 200 of the present embodiment also includes the resin-molded case 10, the sensing chip 20 for detecting pressure provided in the case 10, and the protective material 40 for covering and protecting the sensing chip 20 in the case 10. As shown in FIG. 3, the present embodiment also has the configuration as provided by the above items 1) to 4) to constitute the relative pressure 200.

As shown in FIG. 3, in the pressure sensor 200 according to the present embodiment, obtuse angles are provided to portions of the case 10 contacting the protective material 40, i.e. the corners 18a and 18b that reside in the inner face of the protective material injection chamber 18 and contacting the protective material 40.

As shown in FIG. 3, the obtuse angle of the corners 18a and 18b is attained by tapering a portion of the lower surface 11b of the chip mount 11, which portion is located inside the chamber 18. Specifically, a tapered surface forming a shape of a bowl is provided extending from the lower corner 18a to the upper corner (the corner near the pressure introduction hole 16) 18b. As also shown in FIG. 3, the corners 18a and 18b are adapted to have an angle of 135 degrees or more (i.e. the angle made between the lower surface 11b of the chip mount 11 or a parallel surface to the surface 11b and the tapered surface is 45° or more).

The corners 18a and 18b of the resin-molded case 10 contacting the protective material 40 and each having the obtuse angle may mitigate the concentration of stress at the corners 18a and 18b having a tendency of causing cracks.

Thus, the occurrence of cracks can be prevented as much as possible at the portions of the resin-molded case 10 contacting the protective material 40, in the pressure sensor 200 having the sensing chip 20 for detecting pressure, which chip is located in the case 10 being covered with and protected by the protective material 40, or particularly in the relative pressure sensor 200 having the sensing chip 20 whose rear surface is sealed.

The present embodiment is configured such that the angle made between the lower surface 11b of the chip mount 11 and the tapered surface is 45° or more. The obtuse angle of the corners 18a and 18b may contribute, as described above, to mitigating the concentration of stress, thereby preventing the occurrence of cracks as much as possible. The effects depend on the angles.

The following Table 2 indicates the results of the studies made by the inventors on the relationship between the angle of the corner 18a and production of bubbles. Specifically, the studies involved experiments using a temperature and pressure cycling test, in which a temperature cycle and a pressure cycle were simultaneously applied. In Table 2 below indicating the results of the experiments, the mark "X" represents that bubbles were produced, and the mark "O" represents that no bubbles were produced.

TABLE 2

| Angle(°) | 90 | 100 | 110 | 135 | 160 |
|---|---|---|---|---|---|
| Bubbles | X | X | X | O | O |

O: No bubbles produced
X: Bubbles produced

As can bee seen from Table 2, bubbles were produced when the angle of the corner 18a was less than 135 degrees, and were not produced when the angle of the corner 18a was 135 degrees or more. When bubbles were produced, the rate of production was sufficiently smaller than in the conventional pressure sensors, and thus the effect of suppressing production of bubbles was exerted. Meanwhile, when the angle of the corner 18a was 135 degrees or more, bubbles were more reliably prevented from being produced. Accordingly, use of an angle of 135 degrees or more at each of the corners 18a and 18b can more effectively suppress production of bubbles. However, excessively large angle of the corners 18a and 18b may entail the increase in the size of the cylindrical wall 17. Therefore, the angle may preferably be equal to or less than 160° as indicated in Table 2.

The pressure sensor 200 according to the present embodiment is advantageously provided with the plurality of corners 18a and 18b at the inner face of the protective material injection chamber 18 contacting the protective material 40, and all of the corners have obtuse angles.

Among the plurality of corners 18a and 18b, one that would likely to cause cracks may have an obtuse angle. It is preferable however that all of the plurality of corners 18a and 18b have an obtuse angle.

Further, allowing only one of the plurality of corners 18a and 18b to have an obtuse angle may still exert the effect of preventing the occurrence of cracks.

Specifically, among the corners 18a and 18b provided at the inner face of the protective material injection chamber 18, the obtuse angle may be imparted to only the angle 18a between the cylindrical wall 17 and the lower surface 11b of the chip mount 11, or one surface of the case 10, structuring the chamber 18, although not shown.

Third Embodiment

Figure 4:
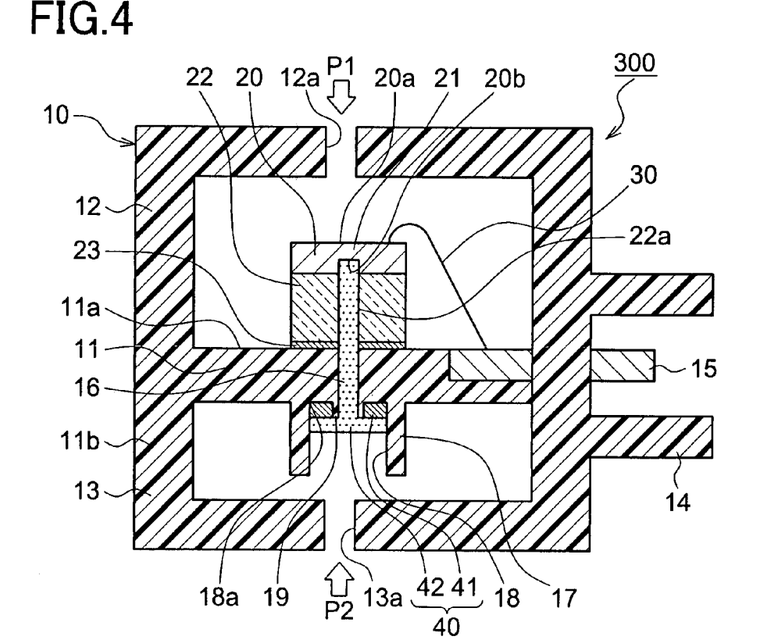
FIG. 4 is a schematic cross sectional view illustrating a relative pressure sensor according to a third embodiment of the present invention.

FIG. 4 is a schematic cross-sectional view of a relative pressure sensor 300 according to a third embodiment of the present invention.

The embodiments described above have contrived the structure of the corners to avoid concentration of stress thereon. The present embodiment contrives a structure in which air is prevented from entering the protective material through cracks in the event such cracks have been caused at the corners of the case.

The pressure sensor 300 of the present embodiment is different from that of the first embodiment in that some changes have been made in the protective material 40 and the protective material injection chamber 18 in the case 10. Other components are the same as those in the first embodiment.

In the example shown in FIG. 4, the angle 18a, for example, of the protective material injection chamber 18, which contacts the protective material 40, is angulated, not rounded.

In the present embodiment, as in the embodiments described above, the pressure introduction hole 16 for introducing pressure to the rear surface 20b of the sensing chip 20 is formed in the lower surface 11b of the chip mount 11, or one surface of the case 10. Also, the cylindrical wall 17 is projected from the lower surface 11b so as to enclose the pressure introduction hole 16 along its periphery.

Further, as in the above embodiments, the inner space defined by the cylindrical wall 17 and the lower surface 11b of the chip mount 11 constitutes the protective material injection chamber 18, and the protective material 40 is filled in the pressure introduction hole 16, the chamber 18 and the hole 22a of the seat 22 to seal the rear surface 20b of the sensing chip 20, thereby constituting the relative pressure sensor 300.

The present embodiment is unique in that the protective material 40 has a two-layer structure consisting of a first protective material 41 provided at a position for contacting the corner 18a of the case 10 and a second protective material 42 softer than the first protective material 41 and covering the first protective material 41.

The case 10 is provided with a dam portion 19 for separating the first protective material 41 from the second protective material 42, whereby the second protective material 42 is permitted to enter the pressure introduction hole 16 toward the sensing chip 20 for contact therewith in a sealed manner.

The unique configuration of the present embodiment may further be explained as follows. In the two-layer structure of the protective material 40 in the relative pressure sensor 300, the first protective material 41 is located at a position for contacting the corner 18a at the inner face of the chamber 18, and the second protective material 42 softer than the first protective material 41 covers the first protective material 41 and fills the hole 16.

The dam portion 19 is provided in the chamber 18, at an opening edge of the hole 16, as a partition between the hole 16 and the first material 41, and the second material 42 is in contact with the rear surface 20b of the sensing chip 20 through the hole 16. In the present embodiment, the dam portion 19 is integrated into the chip mount 11 and is projected from the opening edge of the hole 16.

Figure 5:
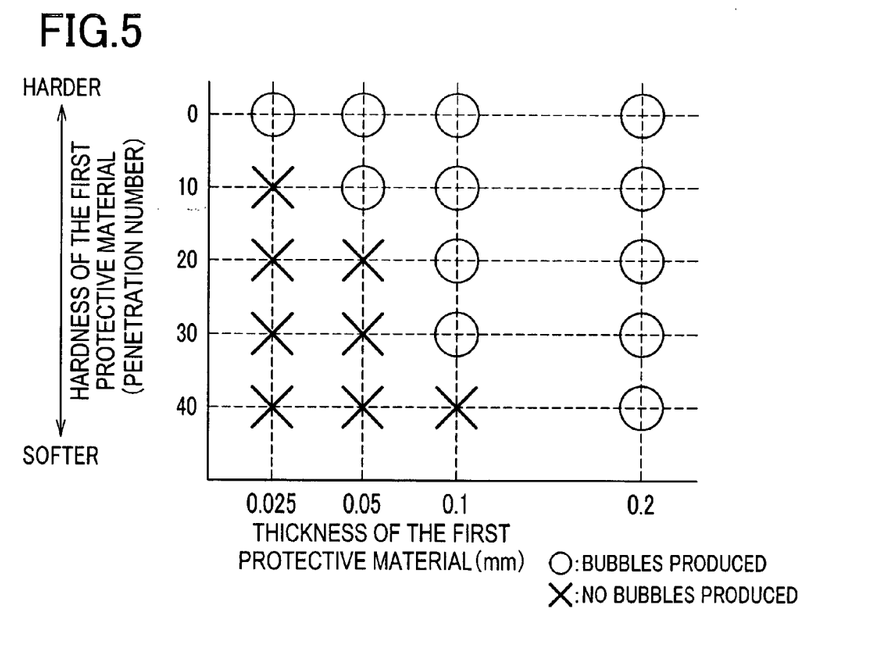
FIG. 5 illustrates a graph indicating the results of study made on the relationship between thickness and hardness of a first protective material and production of bubbles.

Materials for the first and second protective materials 41 and 42 are not particularly limited if only the relationship mentioned above is satisfied. For example, as to the first material 41, it may be a material whose penetration number is 30 or less when the thickness of the material is 0.1 mm or more, or a material whose penetration number is 40 or less when the thickness of the material is 0.2 mm or more. This is based on the results of the studies on the relationship between thickness/hardness of the first material 41 and production of bubbles. FIG. 5 is a graph indicating the relationship resulting from a temperature and pressure cycling test conducted by simultaneously applying a temperature cycle and a pressure cycle. In the graph, the mark "X" represents that bubbles were produced, and the mark "O" represents that no bubbles were produced.

As can be seen from the graph, no bubbles were produced when the thickness of the first material 41 was 0.1 mm or more with a penetration number of 30 or less, and when the thickness was 0.2 mm or more with a penetration number of 40 or less. However, when the penetration number exceeded these values or when the thickness was smaller than these values, bubbles were produced a little, although the rate of production was low comparing with the conventional pressure sensors. Therefore, the first material 41 is adapted to satisfy the relationship mentioned above, so that production of bubbles can be further suppressed.

Materials for the comparatively hard first protective material 41 include, but not limited to, rubber materials, such as fluororubber and silicone rubber. Materials for the comparatively soft second protective material 42 include, but not limited to, gels, such as fluorine gels and silicone gels.

In the present embodiment as well, where the pressure of exhaust gas is measured, a fluorine-based rubber material or a gel having good acid resistivity should desirably be used as the protective material 40 because the condensate of exhaust gas, which is melt with nitrogen oxides or sulfur oxides, exerts strong acidness.

The first and second protective materials 41 and 42 may both be gels. In this case, the hardness of the materials 41 and 42 may be determined based, for example, of the penetration numbers as standardized in JIS (Japanese Industrial Standards).

The hardness may be differentiated between the materials 41 and 42 by differentiating the gels. Gels mixed with fillers, such as silica, may be used. In this case, by differentiating the ratio of the fillers between the materials 41 and 42, the hardness may be differentiated between the materials 41 and 42.

As in the embodiments described above, the pressure sensor 300 of the present embodiment having the two-layer structure consisting of the protective materials 41 and 42 can be manufactured by fixedly adhering the sensing chip 20, which is integrated with the seat 22, onto the upper surface 11a of the chip mount 11 of the case 10, followed by wire bonding, and by sequentially injecting the first and second protective materials 41 and 42 into the protective material injection chamber 18, followed by curing.

In injecting the protective material 40, the presence of the dam portion 19 can prevent the firstly injected first material 41 from entering the pressure introduction hole 16 toward the rear surface 20b of the sensing chip 20.

The operation for detecting pressure in the pressure sensor 300 of the present embodiment is performed in the same fashion as in the embodiments described above.

As described above, the present embodiment can provide the pressure sensor 300 including the resin-molded case 10, the sensing chip 20 provided in the case 10 for detecting pressure, and the protective material 40 covering and protecting the sensing chip 20 in the case 10. In the pressure sensor 300, the protective material 40 advantageously has a two-layer structure consisting of the first protective material 41 provided at a position for contacting the corner 18a of the case 10 and the second protective material 42 softer than the first protective material 41 and covering the first protective material 41. Further, the dam portion 19 provided for separating the first material 41 from the second material 42 can permit the second material 42 to enter the pressure introduction hole 16 toward the sensing chip 20 for contact therewith in a seated manner.

Also, the present embodiment can provide the pressure sensor 300, or the relative pressure sensor 300, having the configuration as provided by the above items 1) to 4). In the relative pressure sensor 300, the protective material 40 has a two-layer structure consisting of the first protective material 41 located at a position for contacting the corner 18a at the inner face of the protective material injection chamber 18, and the second protective material 42 softer than the first protective material 41 and covering the first protective material 41 and located at the pressure introduction hole 16. In the chamber 18, the dam portion 19 is provided at the opening edge of the pressure introduction hole 16 to serve as a partition between the hole 16 and the first material 41. The second material 42 is in contact with the rear surface 20b of the sensing chip 20 through the hole 16.

According to the present embodiment, the protective material 40 has a two-layer structure consisting of the comparatively hard first protective material 41 and the comparatively soft second protective material 42. In the two-layer structure, the first material 41 is located at a position for contacting the corner 18a of the case 10, that is, the corner 18a provided at the inner face of the protective material injection chamber 18.

The pressure sensor 300 according to the present embodiment has the angulated corner 18a as in the conventional pressure sensors, which corner is liable to cause cracks. However, as shown in FIG. 4, in the event cracks have been caused at the corner 18a, the comparatively hard first protective material 41 can suppress the entry of bubbles through the cracks.

Further, according to the present embodiment, the dam portion 19 provided in the protective material injection chamber 18, at the opening edge of the pressure introduction hole 16, for serving as a partition between the hole 16 and the first material 41, can permit the comparatively soft second protective material 42 to enter the hole 16 for contact with the rear surface 20b of the sensing chip 20. Accordingly, the measuring pressure force can be transmitted to the rear surface 20b of the sensing chip 20 through the second material 42, which is as soft as the one in the conventional pressure sensors. Thus, the function of detection of the sensor can be retained as in the conventional pressure sensors.

According to the present embodiment, entry of bubbles into the protective material 40 through cracks can be prevented as much as possible in the event such cracks are caused at the portions of the resin-molded case 10 contacting the protective material 40, in the pressure sensor 300 having the sensing chip 20 for detecting pressure, which chip is located in the case 10 being covered with and protected by the protective material 40, or particularly in the relative pressure sensor 300 having the sensing chip 20 whose rear surface is sealed.

[First Modification]

Figure 6:
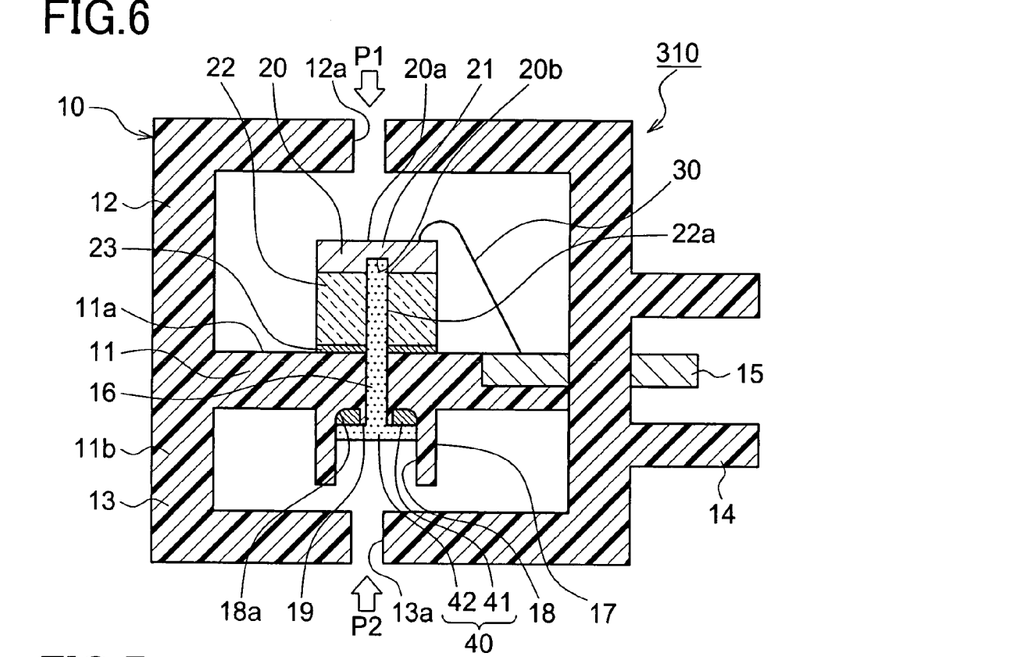
FIG. 6 is a schematic cross sectional view illustrating a relative pressure sensor as a modification of the third embodiment.

FIG. 6 is a schematic cross-sectional view of a relative pressure sensor 310 as a modification of the third embodiment.

The present modification is a combination of the third embodiment with the first embodiment. In particular, the pressure sensor 310 includes the protective materials 41 and 42 constituting the two-layer structure and the dam portion 19 as described above. Further, among the corners of the chamber 18 contacting the protective material 40, the corner 18a between the cylindrical wall 17 and the lower surface 11b of the chip mount 11, or one surface of the case 10, is formed into a rounded shape, with a curvature radius of the corner 18a being 0.5 mm or more.

The corner 18a is formed as the same as that described in the first embodiment.

According to the pressure sensor 310 of the present modification, angulated corners can substantially be eliminated, which corners would have tended to cause cracks. Thus, in addition to the advantages of the third embodiment, the occurrence of cracks can further be prevented at the portion of the case 10, which is in contact with the protective material 40. If the corners are provided in plural number, all of the corners should preferably have the rounded shape as in the embodiments described above.

[Second Modification]

Figure 7:
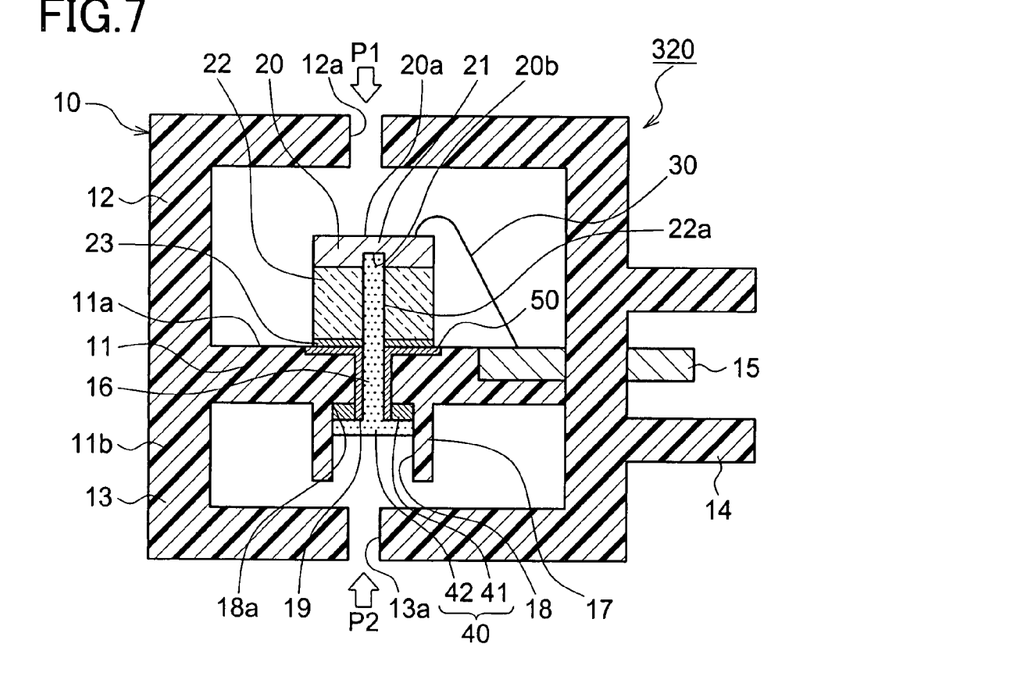
FIG. 7 is a schematic cross sectional view illustrating a relative pressure sensor as another modification of the third embodiment.

FIG. 7 is a schematic cross-sectional view illustrating a relative pressure sensor 320 as another modification of the third embodiment.

In the third embodiment and its first modification described above, the dam portion 19 has been integrally formed with the chip mount 11 of the case 10, or has been made of the resin structuring the case 10.

In the pressure sensor 320 of the present modification, the dam portion 19 is provided separately from the resin-molded case 10. That is, the dam portion 19 is made up of a separate member 50 and is assembled to the case 10. The separate member 50 here is a pipe 50 inserted into the pressure introduction hole 16 formed in the chip mount 11.

The pipe 50 of the present modification has an umbrella-shaped portion located in the upper surface 11a of the chip mount 11 and a cylindrical portion extending from the umbrella-shaped portion and projected out from the lower surface 11b of the chip mount 11. A portion of the cylindrical portion projected out from the lower surface 11b serves as the dam portion 19.

The pipe 50 may be made, for example, of metal, such as stainless steel or 42 alloy, and ceramics. In assembling the pipe 50 into the case 10, insert molding may be used. Alternatively, the pipe 50 may press fitted or adhered to the case 10 from the rear thereof.

Preferably, a material used for the pipe 50 may have a linear expansion coefficient which is equal to that of glass constituting the seat 22 or of silicon constituting the sensing chip 20. This can suppress the variation in the characteristics that would have been ascribed to the difference in the linear expansion coefficient between the pipe 50, and the seat 22 and the sensing chip 20. Also, it is preferable that the pipe 50 may be made of a material having excellent corrosion resistance. Thus, the pressure sensor 320 may be suitably used under the circumstances of exhaust gas which tends to induce corrosion.

Other Embodiments

In the embodiments described above, the protective material injection chamber 18 has been structured by the cylindrical wall 17 having a diameter larger than that of the pressure introduction hole 16. Thus, this structure necessarily provided the corner 18a between the cylindrical wall 17 and the lower surface 11b of the chip mount 11.

It should be appreciated that the shape of the chamber 18 is not limited to the one shown in FIG. 1. For example, the chamber 18 may have an S-shaped cross section to provide rounded corners.

Further, the diameter of the cylindrical wall 17 may be equal to that of the pressure introduction hole 16. In particular, the inner face of the cylindrical wall 17 and that of the hole 16 may reside in a single plane, so that a single continuous and straight hole can be provided, with no stepped portion being formed between the inner hole of the protective material injection chamber 18 and the hole 16.

In this case, since the chamber 18, or the case 10, has no angulated corner at the position for contacting the protective material 40, the occurrence of cracks can be prevented as much as possible, which cracks would have otherwise been caused at the portions of the case 10 contacting the protective material 40.

The case 10 in each of the above embodiments is just an example that can be applied to the present invention, and thus should not be limited to the one shown in each figure.

The sensing chip 20 in the relative pressure sensor may be one other than the semiconductor diaphragm mentioned above, if only the sensing chip can perform pressure detection based on the differential pressure between the pressure forces applied to the front and rear surfaces 20a and 20b.

In each of the relative pressure sensors according to the embodiments described above, sealing has been effected to the rear surface 20b of the sensing chip 20. Alternatively, in case where the front surface 20a of the sensing chip 20 is covered and protected by the protective material, the configuration as described above having the rounded corners or the two-layer structure protective material may be applicable. Further, the present invention can be applied not only to a relative pressure-type pressure sensor, but also to an absolute pressure-type pressure sensor.

What is claimed is:

1. A pressure sensor, comprising:
   a case made of resin and formed to a corner;
   a sensing chip mounted in the case to sense pressure applied to the sensing chip; and
   a protective material arranged in the case to cover the sensing chip for protection thereof, the corner contacting the protective material arranged in the case, wherein the proactive material is composed of a first protective material arranged to contact the corner and a second protective material arranged to cover the first protective material, formed to be softer from the first protective material, and arranged to contact the sensing chip; and
   a dam portion protruded from the case to prevent the first protective material from shifting toward the second protective material.

2. The pressure sensor of claim 1, wherein the first protective material is made of either a material having a penetration number of 30 or less and a thickness of 0.1 mm or more or a material having a penetration number of 40 or less and a thickness of 0.2 mm or more.

3. The pressure sensor of claim 2, wherein
   the case has a mounting portion at which the sensing chip is mounted,
   the sensing chip has a first sensing surface and a second sensing surface to both of which the pressure is applied,
   the mounting portion has i) a recess portion having both ends one of which is opened from the mounting portion, the recess portion introducing the pressure to the second sensing surface of the sensing chip, and ii) a wall portion building from the mounting portion so as to surround an opening of the recess portion and to form a protective material injection chamber, the other end of the recess portion being bottomed by the second surface of the sensing chip, the recess portion and the protective material injection chamber being charged with the second protective material to allow the protective material to seal the second sensing surface of the sensing chip, and
   the dam portion is located within the protective material injection chamber and build around the opening of the recess portion of the mounting portion.

4. The pressure sensor of claim 3, wherein
   the protective material injection chamber has a corner contacting the second protective material and being rounded to have a curvature radius of 0.5 mm or more.

5. The pressure sensor of claim 4, wherein
   the protective material injection chamber is wider in diameter from the recess portion, and
   the corner is located at a part connecting a wall of the chamber to a bottom thereof.

6. The pressure sensor of claim 1, wherein the first protective material is made of rubber material and the second protective material is made of gel.

7. The pressure sensor of claim 1, wherein the dam portion is formed as a member separated from the case and attached to the case so as to protrude from the mounting portion.

* * * * *